US008288752B2

(12) United States Patent
Park

(10) Patent No.: US 8,288,752 B2
(45) Date of Patent: Oct. 16, 2012

(54) PHASE CHANGE MEMORY DEVICE CAPABLE OF REDUCING DISTURBANCE AND METHOD OF MANUFACTURING THE SAME

(75) Inventor: Nam Kyun Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 97 days.

(21) Appl. No.: 12/833,116

(22) Filed: Jul. 9, 2010

(65) Prior Publication Data

US 2011/0266516 A1    Nov. 3, 2011

(30) Foreign Application Priority Data

Apr. 30, 2010    (KR) .................. 10-2010-0040959

(51) Int. Cl.
*H01L 21/02* (2006.01)
(52) U.S. Cl. ............. 257/5; 257/2; 257/4; 257/E45.002; 257/E21.003; 438/54; 438/221

(58) Field of Classification Search .................. 257/5, 2, 257/3, 4, 311, E45.002, E21.003; 438/54, 438/221
See application file for complete search history.

(56) References Cited

U.S. PATENT DOCUMENTS 7,977,662 B2 * 7/2011 Ryoo et al. .................. 257/5

FOREIGN PATENT DOCUMENTS

| KR | 1020090015783 A | 2/2009 |
| KR | 1020090050302 A | 5/2009 |
| KR | 101038997 B1 | 5/2011 |

* cited by examiner

*Primary Examiner* — Thinh T Nguyen
(74) *Attorney, Agent, or Firm* — Ladas & Parry LLP

(57) ABSTRACT

A phase change memory device includes a plurality of word lines, a plurality of bit lines disposed to be crossed with the plurality of word lines, switching devices disposed at intersections of the plurality of word lines and the plurality of bit lines, heating electrodes connected to the switching devices respectively, heat absorbing layers disposed between adjacent heating electrodes, and phase change layers formed on the heating electrodes and the heat absorbing layers and extended in the same direction of the bit line.

10 Claims, 4 Drawing Sheets

"PHASE CHANGE MEMORY DEVICE CAPABLE OF REDUCING DISTURBANCE AND METHOD OF MANUFACTURING THE SAME"

CROSS-REFERENCES TO RELATED APPLICATION

The present application claims priority under 35 U.S.C. 119(a) to Korean application number 10-2010-0040959, filed on Apr. 30, 2010, in the Korean Patent Office, which is incorporated by reference in its entirety as if set forth in full.

BACKGROUND OF THE INVENTION

1. Technical Field

The inventive concept relates to a non-volatile semiconductor memory device and, more particularly, to a phase change memory device capable of reducing disturbance and a method of manufacturing the same.

2. Related Art

Semiconductor memory devices are classified into volatile memory devices and nonvolatile memory devices depending on retention of stored data in power off. DRAMs (Dynamic Random Access Memories) and SRAMs (Static Random Access Memories) are regarded as volatile memory devices and flash memory devices and EEPROMs (Electrically Erasable Programmable Read Only Memories) are regarded as nonvolatile memory devices.

Flash memory devices which are nonvolatile memory devices are generally used in electronic appliances such as digital cameras, cellular phones, or MP3 players. However, it takes a long time to program data in the flash memory devices or to read from the flash memory devices. New semiconductor devices as a substitute of flash memory devices such as MRAM (Magnetic Random Access Memory), FRAM (Ferroelectric Random Access Memory) or Phase-change Random Access Memory have been developed.

A phase change memory device as a substitute memory device uses phase change material which is mutually phase-changed between a crystalline state and an amorphous state by heat as a storage medium. Typically, a chalcogenide (GST)-based material which is comprised of germanium (Ge), antimony (Sb) and tellurium (Te) is used as the phase change material. The heat supply source for the phase change material is current and an amount of heat depends on the intensity of the supplied current and the current supply time. At this time, since the phase change material has a different resistance according to the crystalline state, the logic information depends on the resistance difference.

However, as integrity of the phase memory device is increased, the distance between the heating electrodes is decreased. When the heating electrode is heated by supplying the current so as to write the specific cell which the information is to be obtained from, the adjacent cell which the information has been already read from is affected by the heat disturbance. The heat disturbance causes errors in the output information processing procedure of the memory device. In particular, the heat disturbance more seriously occurs between phase change memory cells connected to the same bit line.

SUMMARY

According to one aspect of an exemplary embodiment, a phase change memory device includes a plurality of word lines, a plurality of bit lines disposed to be crossed with the plurality of word lines, switching devices arranged at intersections of the plurality of word lines and the plurality of bit lines respectively, heating electrodes connected to the switching devices respectively, heat absorbing layers disposed between adjacent heating electrodes and phase change layers formed on the heating electrodes and the heat absorbing layers and extended in the same direction as the bit line.

According to another aspect of another exemplary embodiment, a phase change memory device includes a semiconductor substrate which active regions are defined in, a plurality of word lines formed in the active regions, a plurality of diodes formed on portions of the plurality of word lines, heating electrodes formed on the plurality of diodes, respectively, an interlayer insulating layer insulating between the heating electrodes, heat absorbing layers formed in portions of the interlayer insulating layer between adjacent heating electrodes, respectively, phase change layers formed on the interlayer insulating layer, the heating electrodes and the heat absorbing layers and a plurality of bit lines disposed on the phase change layers and formed to be crossed with the plurality of word lines.

According to another aspect of another exemplary embodiment, a method of fabricating a phase change memory device is provided. A plurality of switching devices are formed on a semiconductor substrate to be insulated by a first interlayer insulating layer. A second interlayer insulating layer is formed on the first interlayer insulating layer. First heating electrode contact holes are formed in the second interlayer insulating layer to expose the plurality of switching devices. Heating pads are formed on a portion of the first heating electrode contact holes, such as the bottoms for example. A third interlayer insulating layer is formed to be buried within the first heating electrode contact holes on the heating pads. Second heating electrode contact holes are formed to expose portions of the heating pad and portions of the second interlayer insulating layer by etching the third interlayer insulating layer and portions of the second interlayer insulating layer adjacent to the third interlayer insulating layer. Heating pillars are formed on a portion, such as the sidewalls for example, of the second heating electrode contact holes to be contacted with exposed portions of the heating pads, and heat absorbing layers are formed on exposed portions of the second interlayer insulating layer.

According to another aspect of another exemplary embodiment, a method of fabricating a phase change memory device is provided. A semiconductor substrate including a plurality of switching devices connected to word lines is provided. Heating electrodes are formed on the plurality of switching devices, respectively. Heat absorbing layers are formed between adjacent heating electrodes. A phase change layer is formed to be contacted with the heating electrodes and the heat absorbing layers. The heating electrodes and heat absorbing layers are formed to be insulated from each other.

These and other features, aspects, and embodiments are described below in the section entitled "DESCRIPTION OF EXEMPLARY EMBODIMENT".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EXEMPLARY EMBODIMENT

Figure 1:
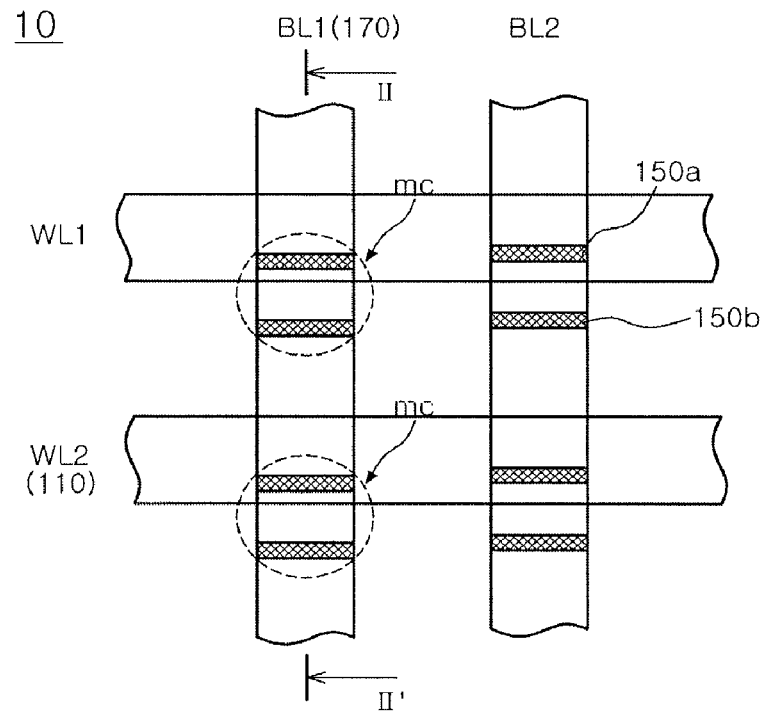
FIG. 1 is a plane view of a phase change memory device according to an exemplary embodiment.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Figure 2:
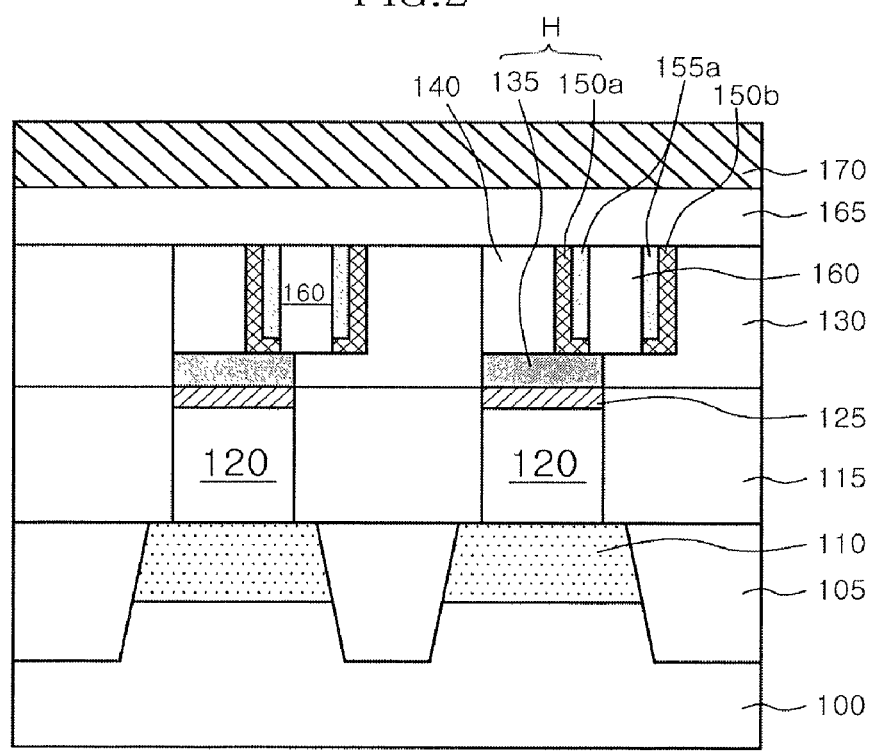
FIG. 2 is a sectional view of the phase change memory device taken along the line of FIG. 1.

Referring to FIGS. 1 and 2, a phase change memory device 10 includes a plurality of word lines WL1 and WL2 and a plurality of bit lines BL1 and BL2 which are crossed with each other. In the embodiment, for convenience, only a pair of word lines WL1 and WL2 and a pair of bit lines BL1 and BL2 are illustrated to be described.

For example, the word lines WL1 and WL2 may have a type of a junction region 110 which is formed in a semiconductor substrate 100 and the bit lines BL1 and BL2 may have a type of a conduction wiring 170 which is formed on the semiconductor substrate 100. Memory cells mc are disposed at interconnections of the plurality of word lines WL1 and WL2 and the plurality of bit lines BL1 and BL2. The reference numeral 105 indicates an isolation layer and the reference numeral 155a indicates a spacer.

For example, Each memory cell mc may include a diode 120 electrically connected to the word line 110, a heating electrode H electrically connected to the diode 120 and a phase changer layer 165 which heat is applied thereto from the heat electrode H. The heating electrode H may include a heating pad 135 electrically connected to the diode 120 and a heating pillar 150a protruded from the heating pad 135 in order to improve the contact resistance with the diode 120 and reduce the contact dimension with the phase change layer 165, thereby maximizing the heating property. The heating pillar 150a may be protruded upward for example, so as to have a relatively narrower line width than the heating pad 135.

The heating pad 135 and the heating pillar 150a may have the same material or have different materials each other. The heating pad 135 and the heating pillar 150a are comprised of any one of a metal layer such W, Ti, Mo, Ta or Pt, a metal nitride layer such as TiN, TaN, WN, MoN, NbN, TiSiN, TiAlN, TiBN, ZrSiN, WSiN, WBN, ZrAlN, MoSiN, MoAlN, TaSiN or TaAlN, a silicide layer such as TiSi or TaSi, a metal alloy layer such TiW or a metal oxide (nitride) layer such as TiON, TiAlON, WON, TaON, IrO$_2$.

An ohmic contact layer 125 may be interposed between the diode 120 and the heating pad 135. Also, the phase change layer 165 is formed to be parallel to the bit line BL1 or BL2 and to be overlapped with the bit line BL1 or BL2.

In the exemplary embodiment, the phase change memory device 10 may further includes a heat absorbing layer 150b which is disposed between adjacent memory cells mc on the same bit line BL1 or BL2 in order to reduce thermal disturbance between the memory cells mc connected to the same bit line BL1 or BL2. The heat absorbing layer 150b may be comprised of a heat absorbable conduction layer and may be configured to be floating. Preferably, the heat absorbing layer 150b may be comprised of the same material as the heating pillar 150a.

As described above, the heat absorbing layer 150b is disposed between the adjacent memory cells mc, preferably between the adjacent heating electrodes H on the same bit line BL1 or BL2 to absorb the heat dispersed to the adjacent memory cell mc.

Hereinafter, a method of manufacturing the phase change memory device 10 having the heat absorbing layer 150b will be described in more detail with reference to FIGS. 3 to 7.

Figure 3:
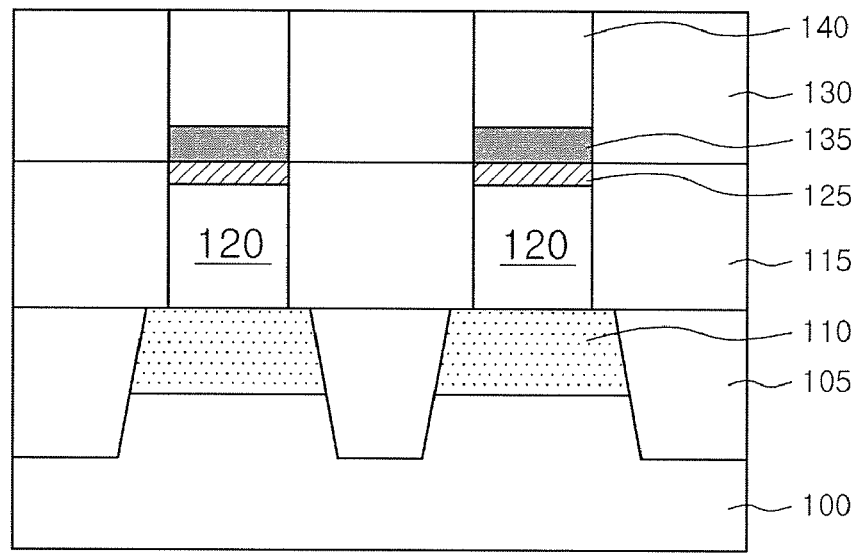
FIGS. 3 to 7 are sectional views illustrating a method of a phase change memory device according to an exemplary embodiment.

Referring to FIG. 3, the isolation layer 105 is formed by a conventional method to define active regions. The junction region type word lines 110 (Hereinafter, referred as to a junction word line) are formed by implanting impurities in a predetermined depth into each of the active regions.

A first interlayer insulating layer 115 is formed on the semiconductor substrate 100 which the junction word lines 110 are formed in and then etched to form diode contact holes (not shown) exposing portions of the junction word lines 110. At this time, the diode contact holes may be disposed near the intersections of the junction word lines 110 and bit lines which are to be formed in the following process. Diodes 120 as a switching device are formed within the diode contact holes by a conventional method. In the exemplary embodiment, for example, the diode 120 may have a PN diode type. The PN diode 120 may be formed by forming an n-type selective epitaxial growth (SEG) layer within the diode contact hole and implanting p type impurities into an upper portion of the n-type SEG layer.

Also, when the metal word line (not shown) is interposed between the diode 120 and the junction word line 110 under the consideration of the resistance in the junction word line 110, the diode 120 may be comprised of a Schottky diode which is formed of a polysilicon layer for example.

A transition metal layer (not shown) is deposited on a resultant of the semiconductor substrate 100 which the diode 120 is formed on and then heat treated to selectively form the ohmic contact layers 125 on the diodes 120. Subsequently, the remaining transition metal layer is removed.

A second interlayer insulating layer 130 is formed on a resultant of the semiconductor substrate 100 which the ohmic contact is layers 125 are formed on. The second interlayer insulating layer 130 is etched to form first heating electrode contact holes (not shown) exposing the ohmic contact layers 125. A conduction layer is formed to be buried within the first heating electrode contact holes. The conduction layer may be comprised of any one of a metal layer such as Ti, Mo, Ta or Pt, a metal nitride layer such as TiN, TaN, WN, MoN, NbN, TiSiN, TiAlN, TiBN, ZrSiN, WSiN, WBN, ZrAlN, MoSiN, MoAlN, TaSiN or TaAlN, a silicide layer such as TiSi or TaSi, an alloy layer such as TiW, and a metal oxide (nitride) layer such as TiON, TiAlON, WON, TaON, or IrO2.

Subsequently, the conduction layer which is formed within first heating electrode contact holes is etched back to remain on portions, such as the bottoms for example, of the first heating electrode contact holes, thereby forming the heating pads 135. Next, a third interlayer insulating layer 140 is buried within the first heating electrode contact holes on the heating pads 135. A silicon nitride layer having the excellent heat endurance property may be used as the second and third interlayer insulating layers 120 and 130.

Figure 4:
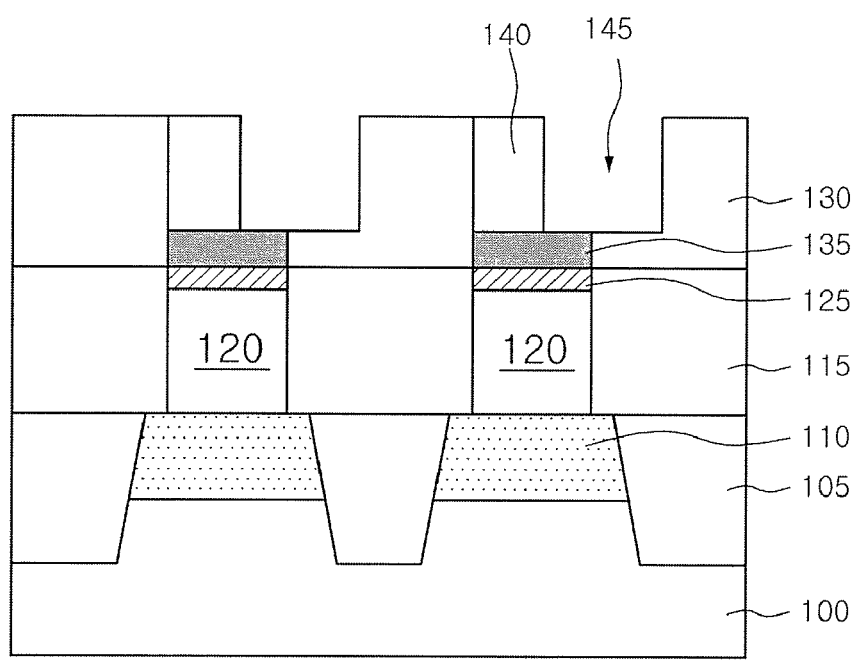

Referring to FIG. 4, the second and third interlayer insulating layers 120 and 130 are etched to expose portions of the heating pads 135 and portions of the second interlayer insulating layer 130 adjacent to the heating pads 135, thereby forming second heating electrode contact holes 145 in the second and third interlayer insulating layers 130 and 140.

Figure 5:
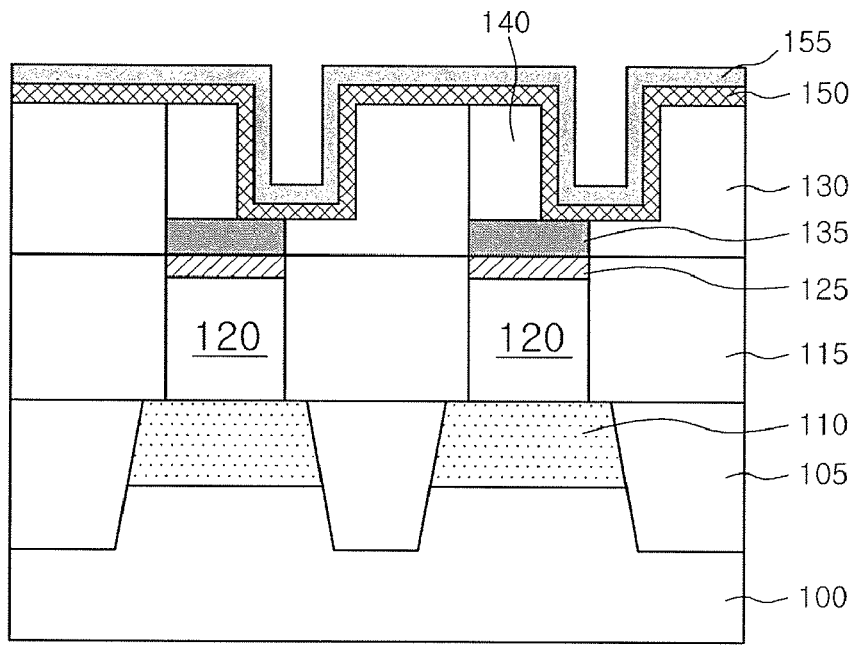

Next, referring to FIG. 5, a conduction layer 150 and a spacer layer 155 are conformally deposited in turn along surfaces of the second heating electrode contact holes 145. For example, the conduction layer may be comprised of any one of a metal layer such as Ti, Mo, Ta or Pt, a metal nitride layer such as TiN, TaN, WN, MoN, NbN, TiSiN, TiAlN, TiBN, ZrSiN, WSiN, WBN, ZrAlN, MoSiN, MoAlN, TaSiN or TaAlN, a silicide layer such as TiSi or TaSi, an alloy layer such as TiW, and a metal oxide (nitride) layer such as TiON, TiAlON, WON, TaON, or IrO2. The spacer layer 155 may be comprised of an insulating layer, for example.

Figure 6:
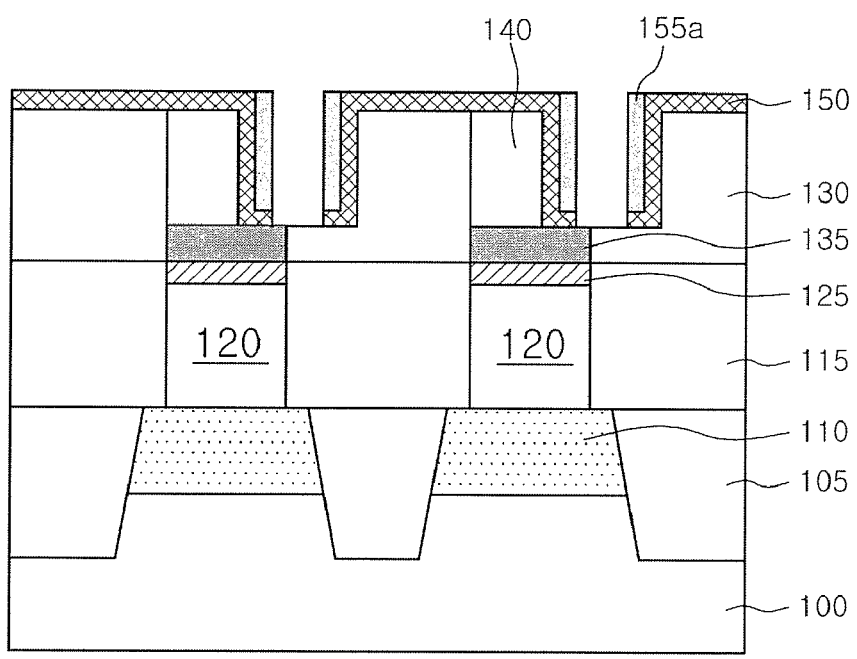

Referring to FIG. 6, the spacer layer 155 is anisotropically etched to expose the conduction layer 150, thereby forming spacers 155a on portions, such as sidewalls for example, of the second heating electrode contact holes 145.

Figure 7:
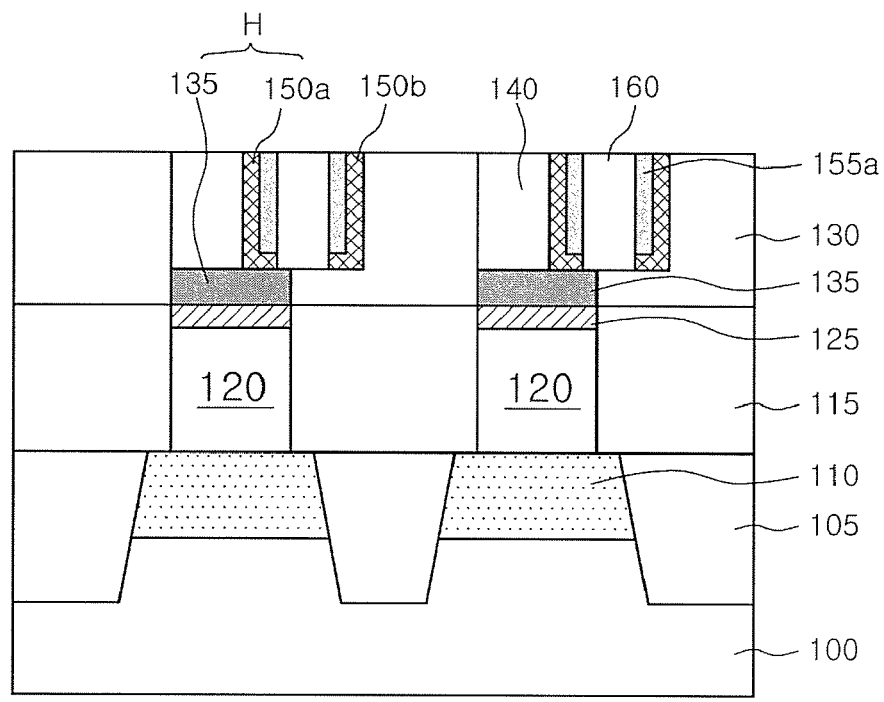

Referring to FIG. 7, the conduction layer 150 is etched by using the spacers 155a as a mask to form the heating pillars 150a and the heat absorbing layers 150b which have separated spacer shapes. At this time, although the heating pillars 150a and the heat absorbing layers 150b are formed by using the same material through the same process, the heating pillars 150a are formed to be connected to the heating pads 135, thereby constituting the heat electrodes H with the heating pads 135. On the other hand, the heat absorbing layers 150b are disposed between the heating pillars 150a under the state that the heat absorbing layers 150b are electrically disconnected to the heating pillars 150a and the heating pads 135.

Next, a fourth interlayer insulating layer 140 is buried within the second heating electrode contact holes 145. At this time, the distance between the heating pillar 150a and the heat absorbing layer 150b may be controllable by the size of the second heating electrode contact hole 145.

Next, Referring to FIG. 2, a phase change layer 165 and a conduction layer are deposited on a resultant of the semiconductor substrate 100 and patterned in the direction crossed with the junction word line 110, thereby forming bit lines 170.

According to this exemplary embodiment, the phase change memory device forms the heat absorbing layers 150b between adjacent memory cells mc disposed on the same bit line BL1 or BL2. According to this, in heating to write data in corresponding memory cell mc, the heat dispersed to the adjacent memory cell mc is removed by the heat absorbing layer 150b to solve the heat disturbance problem.

The inventive concept is not limited to the above exemplary embodiment.

In the exemplary embodiment, although the junction region type word line is exemplified as the word line, the inventive concept may be similarly adapted to the phase change memory device having the metal word line.

Figure 8:
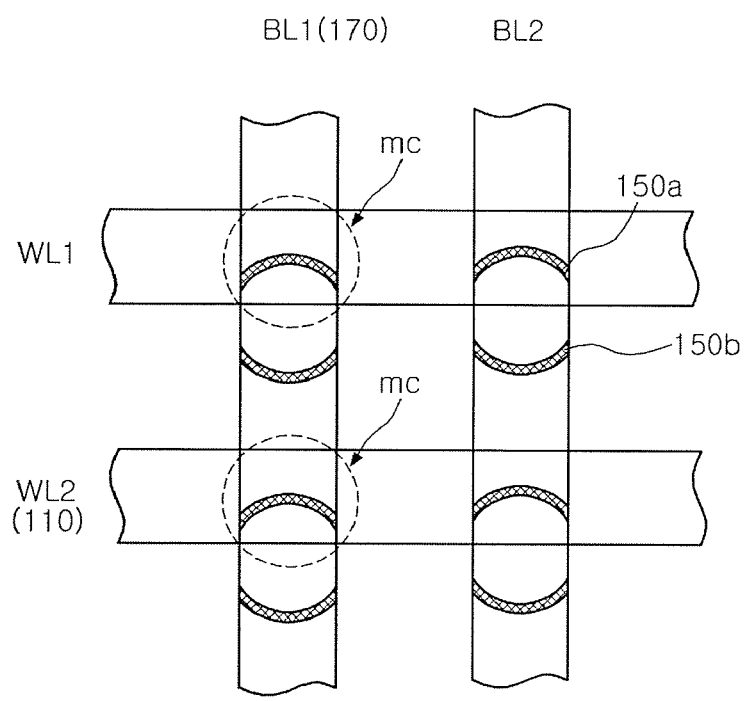
FIG. 8 is a plan view of a phase change memory device according to another exemplary embodiment.

The heating pillar 150a, heat absorbing layer 150b and second heating electrode contact hole 145 may have any desirable shape. For example, the heating pillar 150a and the heat absorbing layer 150b are illustrated as a bar shape in a plan structure, under the assumption that the second heating electrode contact hole 145 has a rectangular shape. However, as shown in FIG. 8, if the second heating electrode contact hole 145 has a circular shape, the heating pillar 150a and the heat absorbing layer 150b may have C-shaped structures.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A phase change memory device, comprising:
   a plurality of word lines;
   a plurality of bit lines disposed to be crossed with the plurality of word lines;
   switching devices disposed at intersections of the plurality of word lines and plurality of the bit lines, respectively;
   heating electrodes connected to the switching devices, respectively;
   heat absorbing layers disposed between adjacent heating electrodes; and
   phase change layers formed on the heating electrodes and the heat absorbing layers, and extended in the same direction as the bit line.

2. The phase change memory device of claim 1, wherein the heat absorbing layers are disposed between the adjacent memory cells connected to the same bit line.

3. The phase change memory device of claim 2, wherein the heat absorbing layer is comprised of a conduction layer which is electrically floating.

4. The phase change memory device of claim 1, wherein each of the heating electrodes includes:
   a heating pad formed on each of the switching devices; and
   a heating pillar extended from a portion of the heating pad.

5. The phase change memory device of claim 4, wherein the heat absorbing layer is comprised of the same material as the heating pillar.

6. A phase change memory device, comprising:
   a semiconductor substrate where active regions are defined;
   a plurality of word lines formed on the active regions;
   a plurality of diodes formed on portions of the plurality of word lines;
   heating electrodes formed on the plurality of diodes, respectively;
   an interlayer insulating layer insulating between the heating electrodes;
   heat absorbing layers formed in the interlayer insulating layer between adjacent heating electrodes, respectively;
   phase change layers formed on the interlayer insulating layer, the heating electrodes and the heat absorbing layers; and
   a plurality of bit lines disposed on the phase change layers and formed to be crossed with the plurality of word lines.

7. The phase change memory device of claim 6, wherein the heat absorbing layers are contacted with the phase change layer which is extended without disconnection, and are disposed between heating electrodes adjacent to each other.

8. The phase change memory device of claim 6, wherein the heat absorbing layer is comprised of a conduction layer which is electrically floating.

9. The phase change memory device of claim 6, wherein each of the heating electrodes comprises:
   a heating pad electrically connected to an upper portion of each of the switching devices; and
   a heating pillar extended from a portion of the heating pad.

10. The phase change memory device of claim 9, wherein the heat absorbing layer is comprised of the same material as the heating pillar.

* * * * *